United States Patent
Ripley et al.

(10) Patent No.: US 7,603,963 B2
(45) Date of Patent: Oct. 20, 2009

(54) CONTROLLED ZONE MICROWAVE PLASMA SYSTEM

(75) Inventors: Edward B. Ripley, Knoxville, TN (US); Roland D. Seals, Oak Ridge, TN (US); Jonathan S. Morrell, Knoxville, TN (US)

(73) Assignee: Babcock & Wilcox Technical Services Y-12, LLC, Oak Ridge, TN (US)

( * ) Notice: Subject to any disclaimer, the term of this patent is extended or adjusted under 35 U.S.C. 154(b) by 268 days.

(21) Appl. No.: 11/415,839

(22) Filed: May 2, 2006

(65) Prior Publication Data

US 2007/0259129 A1    Nov. 8, 2007

(51) Int. Cl.
C23C 16/00 (2006.01)
C23F 1/00 (2006.01)
H01L 21/306 (2006.01)

(52) U.S. Cl. ............ 118/723 MW; 118/723 E; 118/723 ME; 118/723 ER; 156/345.36; 156/345.41

(58) Field of Classification Search ......... 118/723 MW, 118/723 ER, 723 E, 723 ME; 156/345.36, 156/345.41
See application file for complete search history.

(56) References Cited

U.S. PATENT DOCUMENTS

| | | | |
|---|---|---|---|
| 5,234,723 A * | 8/1993 | Babacz | 427/491 |
| 5,270,616 A | 12/1993 | Itatani | |
| 5,273,587 A | 12/1993 | Guha et al. | |
| 5,603,771 A | 2/1997 | Seiberras et al. | |
| 5,620,743 A * | 4/1997 | Harth et al. | 427/213 |
| 6,204,606 B1 | 3/2001 | Spence et al. | |
| 6,246,175 B1 | 6/2001 | Kou et al. | |
| 6,401,653 B1 | 6/2002 | Taniguchi et al. | |
| 6,437,512 B1 | 8/2002 | Chen et al. | |
| 6,525,481 B1 | 2/2003 | Klima et al. | |
| 6,607,633 B2 | 8/2003 | Noguchi | |
| 6,666,923 B1 | 12/2003 | Jeong et al. | |
| 6,667,577 B2 | 12/2003 | Shannon et al. | |
| 6,675,737 B2 | 1/2004 | Hongoh et al. | |
| 6,726,802 B2 | 4/2004 | Tadera et al. | |
| 6,729,261 B2 | 5/2004 | Hongo | |
| 6,998,565 B2 * | 2/2006 | Shinohara | 219/121.43 |
| 2001/0018127 A1 * | 8/2001 | David et al. | 428/404 |

(Continued)

FOREIGN PATENT DOCUMENTS

EP      1 377 138      1/2004

(Continued)

OTHER PUBLICATIONS

JP 07-263187_Eng dated Oct. 13, 1995 (Watanabe et al).*

(Continued)

*Primary Examiner*—Parviz Hassanzadeh
*Assistant Examiner*—Rakesh K Dhingra
(74) *Attorney, Agent, or Firm*—Michael J. Renner; Luedeka, Neely & Graham, P.C.

(57) ABSTRACT

An apparatus and method for initiating a process gas plasma. A conductive plate having a plurality of conductive fingers is positioned in a microwave applicator. An arc forms between the conductive fingers to initiate the formation of a plasma. A transport mechanism may convey process materials through the plasma. A spray port may be provided to expel processed materials.

10 Claims, 9 Drawing Sheets

U.S. PATENT DOCUMENTS

| | | | |
|---|---|---|---|
| 2002/0002948 A1* | 1/2002 | Hongo et al. | 118/723 R |
| 2003/0106643 A1* | 6/2003 | Tabuchi et al. | 156/345.35 |
| 2003/0139005 A1 | 7/2003 | Song et al. | |
| 2005/0115933 A1* | 6/2005 | Kong et al. | 219/121.57 |
| 2005/0271829 A1 | 12/2005 | Kumar et al. | |
| 2006/0065195 A1* | 3/2006 | Nagatsu | 118/723 MW |

FOREIGN PATENT DOCUMENTS

| | | | |
|---|---|---|---|
| JP | 2-170978 | * | 7/1990 |
| JP | 07-263187 | * | 10/1995 |

OTHER PUBLICATIONS

Naudin, Jean-Louis / "Plasmoid ( ball lightning ) generation with a microwave resonator" http://jlnlabs.online.fr/plasma/4wres/index.htm / original publication date unknown.

* cited by examiner

CONTROLLED ZONE MICROWAVE PLASMA SYSTEM

GOVERNMENT RIGHTS

The U.S. Government has rights to this invention pursuant to contract number DE-AC05-00OR22800 between the U.S. Department of Energy and BWXT Y-12, L.L.C.

FIELD

This invention relates to the field of microwave plasma generation. More particularly, this invention relates to the initiation of a non-equilibrium plasma.

BACKGROUND

As the term is generally used, a plasma is a gas that has been ionized such that it consists predominantly of positively charged ions and free electrons, together with excited atomic, molecular, and radical species. Plasmas are used for industrial purposes such as microcircuit etching, chemical vapor deposition, and other surface modification processes. Plasma is sometimes referred to as the "fourth state of matter." When gas is in this state, electrons and ions are continuously recombining to form neutral (uncharged) gas molecules. Additional energy must be supplied to the gas to continue the process of dissociation of atoms and molecules into ion-electron pairs. To continuously maintain the gas in a plasma state, the processes of dissociation and recombination of ion electron pairs must of course be at least in equilibrium. A state of equilibrium can be achieved at high temperatures, typically above 2000K for most gases. When temperatures are increased above the equilibrium point, the process of dissociation occurs more rapidly than the process of recombination. This produces very high densities of electrons. Industrial processes typically require these high densities of electrons, but the high temperatures are generally incompatible with the materials being processed. Consequently, residence times must be extremely short. For example, with plasma spray techniques the residence time for materials is only milliseconds. Furthermore, the particle sizes of materials being processed must be relatively small (between about 20 and 50 microns) in order to be heated by the process. These time and size limitations severely restrict the volume of material melting or processing that can be accomplished with a plasma spray system.

As a result of these limitations, research has been conducted on creating plasmas that are sustained by "non-equilibrium ionization processes." These processes are induced by such means as an externally applied electro magnetic field, a particle beam, or laser radiation. For example, low frequency corona discharges are often used for large web or film applications that employ plasma processing. Radio frequency systems are used for some other applications, but low-pressure microwave discharges have been shown to be more efficient at producing ion-electron pairs than radio frequency systems.

However, one of the problems with present systems that incorporate microwave generation of plasmas is difficulty in initiating the plasma. The reason for this is that a body of un-ionized gas is a very poor absorber of microwave energy, especially at the low pressures needed for plasma processing. Current methods for initiating the plasma typically involve temporarily or locally increasing the gas pressure to achieve initiation and that requires a large expenditure of energy. A further problem with present microwave systems is that after initiation of the plasma, some type of confinement system is required in order to maintain the hot zone over a specified distance or throughout a specified volume. Often a large magnetic field is used to focus and constrain the system but the presence of a magnetic field puts severe limitations on the ability to process many types of materials. However, if no confinement system is used, the hot zone rapidly cools and the effective energy volume is so small that many manufacturing processes or material deposition techniques are inefficient and costly.

What is needed is a simpler and more efficient means to initiate, maintain and confine a microwave plasma process.

SUMMARY

The present invention provides a microwave plasma system. The microwave plasma system includes an applicator providing microwaves having at least one wavelength and a process gas in the microwaves. At least one conductive plate is located in the microwaves, with each conductive plate having a plurality of conductive fingers, the conductive fingers being configured to cause arcing in the presence of the process gas and the microwaves and thereby initiating a process gas plasma.

An alternative embodiment provides a microwave plasma system that includes an applicator providing microwaves at one or more wavelengths and having a spray port. There is a source of process gas for flowing the process gas through at least a portion of the applicator and exiting through the spray port. There is also a source of process material for entraining the process material in the process gas. At least one conductive plate is located in the applicator, with each conductive plate having a plurality of conductive fingers, the conductive fingers being configured to cause arcing in the presence of the process gas and the microwaves and thereby initiating a process gas plasma.

The invention also provides a method of modifying a process material. The method begins with providing a microwave applicator having at least one conductive plate with conductive fingers having proximal tips. The method continues with disposing a process gas in the microwave applicator and exposing the conductive fingers to microwave energy until a process gas plasma is initiated. The method concludes with contacting at least a portion of a process material with the plasma.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

This invention discloses a microwave plasma system with applications for materials and structures manufacturing, and an associated method to produce a working volume of high temperature plasma that is not magnetically constrained. In the most preferred embodiments, a microwave plasma system uses an array of electrically conductive fingers to convert a microwave field into a toroidal arc. Then by passing a gas through the arc, plasma is initiated and the electrically conductive fingers confine the plasma. In some embodiments a single stage working hot zone of plasma is established. Other embodiments place consecutive arrays of fingers in close proximity to each other, such that the plasma extends from stage to stage. The length and volume of the hot zone may be tailored to a wide variety of processing requirements.

A preferred method provides a plasma hot zone that may be configured in shape, diameter and length and provides control of the feed velocity for the processing materials and, thus, allows control of the residence time in the plasma for processing materials. This plasma hot zone provides enhanced capability to produce new materials, coating depositions, and/or materials treatments by flowing through and volumetrically processing materials in the controlled, engineered plasma zone area. The length of the defined plasma area and the velocity of the feed materials through the plasma determine the residence time for material that is processed.

No magnetic containment system is required to control the geometry of the plasma volume. By varying the size of apertures in the flow path, diverging and converging volumes of plasma may be created. This provides a very cost-effective way to generate and control plasma.

In the most preferred embodiments, a plurality of conductive fingers having electrical continuity are positioned in a microwave applicator. In most embodiments a process gas is then introduced into the microwave applicator. When microwaves are guided into the applicator, they energize the conductive fingers and the conductive fingers spontaneously initiate a process gas plasma. In some embodiments multiple arrays of conductive fingers may be positioned in series, creating an extended volume of plasma. Process materials may be fed through the plasma. Such an apparatus allows materials to be processed in a high-energy plasma field with the processing time and temperature, or the time of flight, tailored to the desired or required processing needs.

Figure 1A:
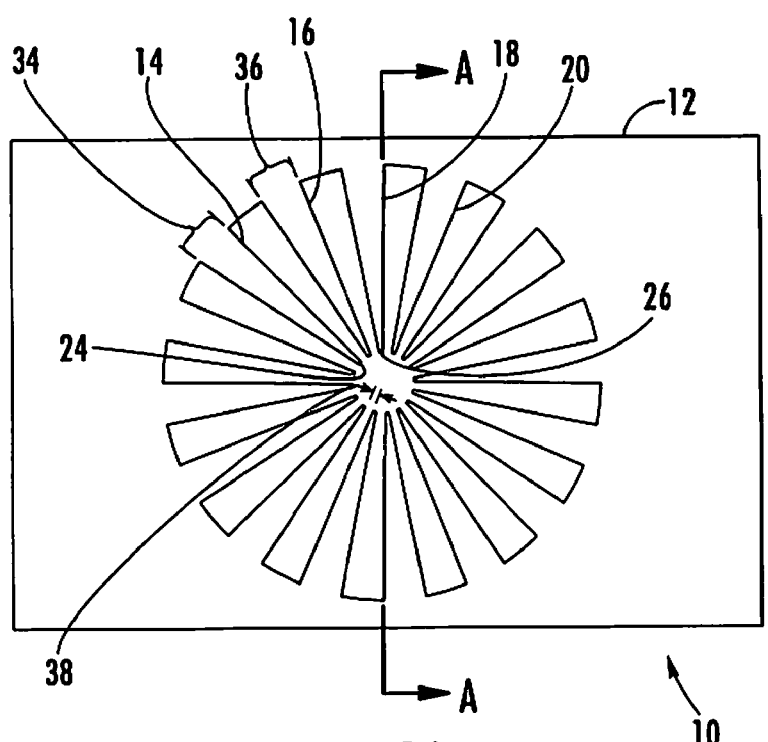
FIG. 1A is an elevation view of a conductive plate having conductive fingers in a closed array configuration.
Figure 1B:
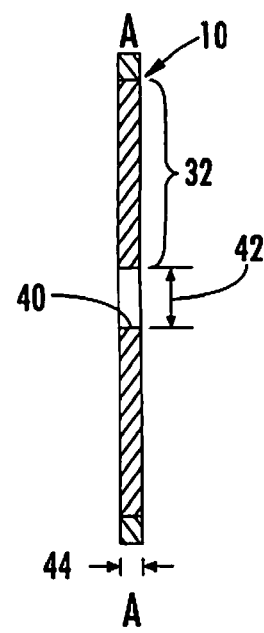
FIG. 1B is the orthogonal elevation view of the conductive plate of FIG. 1A taken through section A-A.

A most preferred embodiment is illustrated in FIGS. 1A and 1B. A plasma generator 10 is shown to incorporate an electrically conductive plate 12. In the most preferred embodiments, conductive plate 12 is fabricated from graphite; however, other high temperature tolerant conductive materials may also be used. For example, conductive plate 12 may be fabricated from boron or tungsten, or fabricated by coating a ceramic substrate with a metallic film or metallic surface layer, or fabricated from a ceramic material containing embedded metal particles. Conductive plate 12 is formed with a series of conductive fingers, with example conductive fingers 14, 16, 18, and 20 being labeled. The conductive fingers (e.g., 14, 16, 18, and 20) are electrically interconnected. In the embodiment of FIGS. 1A and 1B, the conductive fingers (e.g., 14, 16, 18, and 20) are formed as integral elements of conductive plate 12. That integral configuration provides an electrical interconnection between the conductive fingers (e.g., 14, 16, 18, and 20). While tapered conductive fingers (e.g., 14, 16, 18, and 20) are illustrated in FIG. 1A, other shapes may be used such as rods, levers, teeth, projections, or sections separated by notches. In the descriptions herein the term "finger" will be used to encompass all such shapes.

The conductive fingers (e.g., 14, 16, 18, and 20) have tips as illustrated by example tips 24 and 26 at the center of conductive plate 12. Preferably the tips have sharp edges. In FIGS. 1A and 1B, the conductive fingers as illustrated by example conductive fingers 14, 16, 18, and 20 are shown as having substantially the same shape. The conductive fingers as illustrated by example conductive fingers 14, 16, 18 and 20 have a length 32. Example conductive finger 14 is shown to have a base 34 and example conductive finger 16 is shown to have a base 36. The conductive fingers have a spacing with example conductive finger spacing 38 labeled. The conductive fingers converge to an aperture 40 having an aperture diameter 42. The thickness 44 of conductive plate 12 is preferably approximately one sixteenth of an inch (1.59 mm). Thicker or thinner material may be used; however as material becomes progressively thicker, beyond say one fourth inch (6.35 mm) it becomes more difficult to control where arcing occurs.

Most preferably the spacing (e.g., 38) between the conductive fingers (e.g., 14, 16, 18, and 20) increases from their tips (e.g., 24, 26) to their bases (e.g., 34, 36). This design causes the arc that initiates the process gas plasma to be concentrated at the tips (e.g., 24, 26) because the shortest distance between the conductive fingers (e.g., 14, 16, 18, and 20) is at the tips (e.g., 24, 26). Any design in which the shortest distance between conductive fingers is at the tips of the conductive fingers is said to have "proximal tips." Although the tips (e.g., 24, 26) erode and the aperture 40 widens during use, the tips of the conductive fingers (e.g., 14, 16, 18, and 20) remain the closest adjacent points. The resulting plasma remains geometrically constrained by the tips (e.g., 24, 26) of the conductive fingers (e.g., 14, 16, 18, and 20). However, as the tips (e.g., 24, 26) erode, the spacing between the tips (e.g., 24, 26) increases, which decreases the efficiency of the plasma generation process. Eventually efficiency drops to an extent that the conductive plate 12 must be replaced, meaning that the tip life has been reached.

The designed aperture diameter 42 and the length 32 of the conductive fingers may be varied depending upon the particular process requirements. However, most preferably, the length 32 is no shorter than approximately one fourth of the wavelength of microwave (or other electro magnetic field—EMF) energy used with plasma generator 10. Microwaves in the frequency range of approximately 900 MHz (approximately 33 cm wavelength) to 50 GHz (approximately 6 mm wavelength) are typically used, with 2.45 GHz (approximately 12 cm wavelength) being the preferred frequency. Preferably, the aperture diameter 42 should be held to as small a size as process requirements will allow. In this embodiment the aperture 40 is shown as circular and the bases (e.g., 34, 36) of the conductive fingers (e.g., 14, 16, 18, 20) are shown to form a circle. In alternate embodiments the aperture 40 and the form of the bases (e.g., 34, 36) may be any geometric shape, including oval, triangular, square, polygonal, and so forth. A rectangular shape is often preferred for the bases (e.g., 34, 36) because a rectangular shape for the bases (e.g., 34, 36) facilitates mounting the conductive plate 12 by supporting the conductive plate at the sides or at the top and bottom.

For 2.45 GHz microwaves, a preferable microwave plasma system 12 will have an aperture diameter 42 of one half an inch (or less) and a length 32 of approximately one and one half inches. That configuration will allow for adequate tip life before the plasma efficiency drops excessively.

Figure 2:
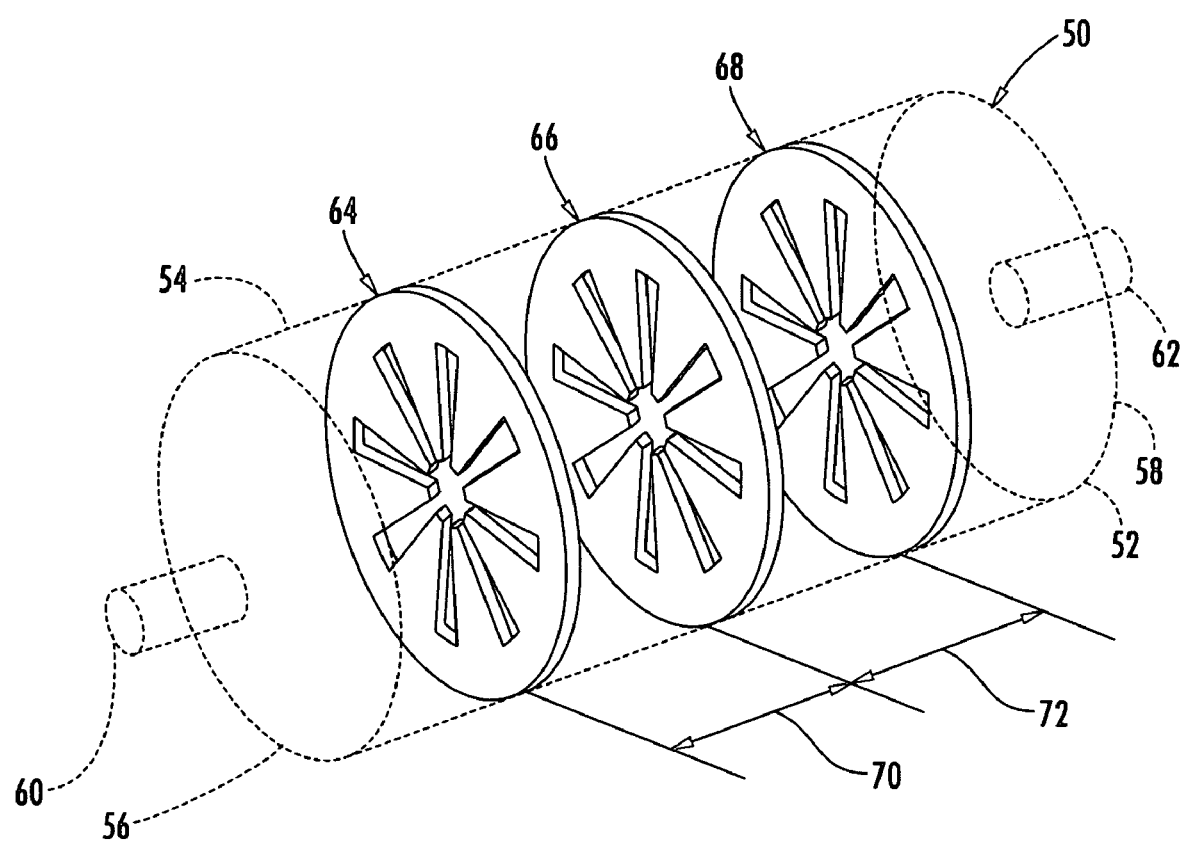
FIG. 2 is a cutaway perspective view of microwave plasma system having three closed array plasma generators.

FIG. 2 illustrates an alternate embodiment of a microwave plasma system 50. The microwave plasma system 50 employs a hollow cylinder 52. Cylinder 52 is shown in dashed lines to more clearly illustrate the contents of cylinder 52. Cylinder 52 has a body 54 with a proximate end cap 56 sealed with the proximate end of body 54, and a distal end cap 58 sealed with the distal end of body 54. Installed in proximate end cap 56 is inlet port 60, and installed in distal end cap 58 is outlet port 62. Three plasma generators 64, 66, and 68 are installed inside cylinder 52. The plasma generators are axially aligned, meaning that apertures of each plasma generator falls on a straight line, and the conductive plates are perpendicular to that straight line. Plasma generator 64 is spaced distance 70 from plasma generator 66, and plasma generator 66 is spaced distance 72 from plasma generator 68. The plasma generators 64, 66, and 68 are similar to the plasma generator 10 illustrated in FIGS. 1A and 1B, except that they have fewer conductive fingers and their circumferences are circular. In preferred embodiments, distance 70 and distance 72 are short enough that the plasma initiated in the apertures of plasma generators 64, 66, and 68 overlaps to form a generally cylindrical volume of plasma. Distances 70 and 72 do not need to be the same distances.

Several alternate configurations may be used to supply microwave energy to microwave plasma system 50. In one embodiment cylinder 52, end cap 56 and end cap 58 are constructed of microwave transparent materials such as gamma alumina or fused quartz, and the cylinder is installed in a conventional microwave oven with inlet port 60 and outlet port 62 extending through the walls of the oven. The escape of microwave energy through inlet port 60 and outlet port 62 may be prevented by appropriately sizing their passageways or installing screens in the passageways. In an alternate embodiment, cylinder 52, end cap 56, and end cap 58 are constructed of metal and a waveguide supplies microwave energy through an opening (not shown) in cylinder 52, or through end cap 56 or end cap 58.

Process gas is supplied to microwave plasma system 50 either through inlet port 60 or through a dedicated port (not shown) in cylinder 52, end cap 56, or end cap 58. The selection of the process gas depends, of course, on the particular process being undertaken. Halocarbons, such as $CF_4$ or $CF_2Cl_2$, are typically used for surface etching. Inert gases, e.g., Ar, are used for sputtering. Ammonia ($NH_3$), boron trichloride ($BCl_3$), and methane ($CH_4$) are used to form nitrides, borides and carbides, respectively, on the surfaces of materials.

In a most preferred embodiment, process material is transported through microwave plasma system 50. Process materials are materials for which plasma treatment is to be applied. Examples of process materials and their treatments are electronic substrates to be etched, metal powders to be oxidized into ceramics, wires to be coated, and fibers to be toughened. The process material enters inlet port 60, is processed by plasma generated by plasma generators 64, 66, and 68, and exits through outlet port 62. Various devices may be used to transport the process material through microwave plasma system 50 and expose it to the plasma. For solid process materials such as wires, rods, and films, a mechanical transport mechanism is typically used. One example of a mechanical transport mechanism is a simple reel to reel winder, where a feed reel supplies wire fed into input port 60 and a take-up reel collects the treated wire as it emerges from outlet port 62. Discontinuous process materials such as electronic components and wear parts typically also use a mechanical transport mechanism such as a conveyer belt or a carousel to expose the process material to the plasma.

Powdered process materials typically use a gas entrainment transport mechanism to move the powder through the plasma. That is, a mechanical mixer introduces the powder into the flow of a carrier gas, and the two are pumped through the plasma. Inert gases such as helium, argon, and nitrogen are typically used as carrier gases, although the process gas itself may also be used as the carrier gas. Other transport mechanisms may also be used. For example, microwave plasma system 50 may be positioned in a vertical orientation with inlet port 60 on top. Gravity may then be used as the transport mechanism to move material from inlet port 60 down to and through outlet port 62. In an alternate vertical configuration inlet port 60 is positioned at the bottom and outlet port 62 is positioned at the top. The process gas may then be used to suspend the process material in the manner of a fluidized bed.

In summary with respect to FIG. 2, microwaves and process gas are introduced into microwave plasma system 50. The microwaves energize the plasma generators 64, 66, and 68 such that they initiate a plasma in the aperture (40 in FIG. 1B) of each. A transport mechanism moves process material through inlet port 60, through the plasma, and then out through outlet port 62.

Figure 3:
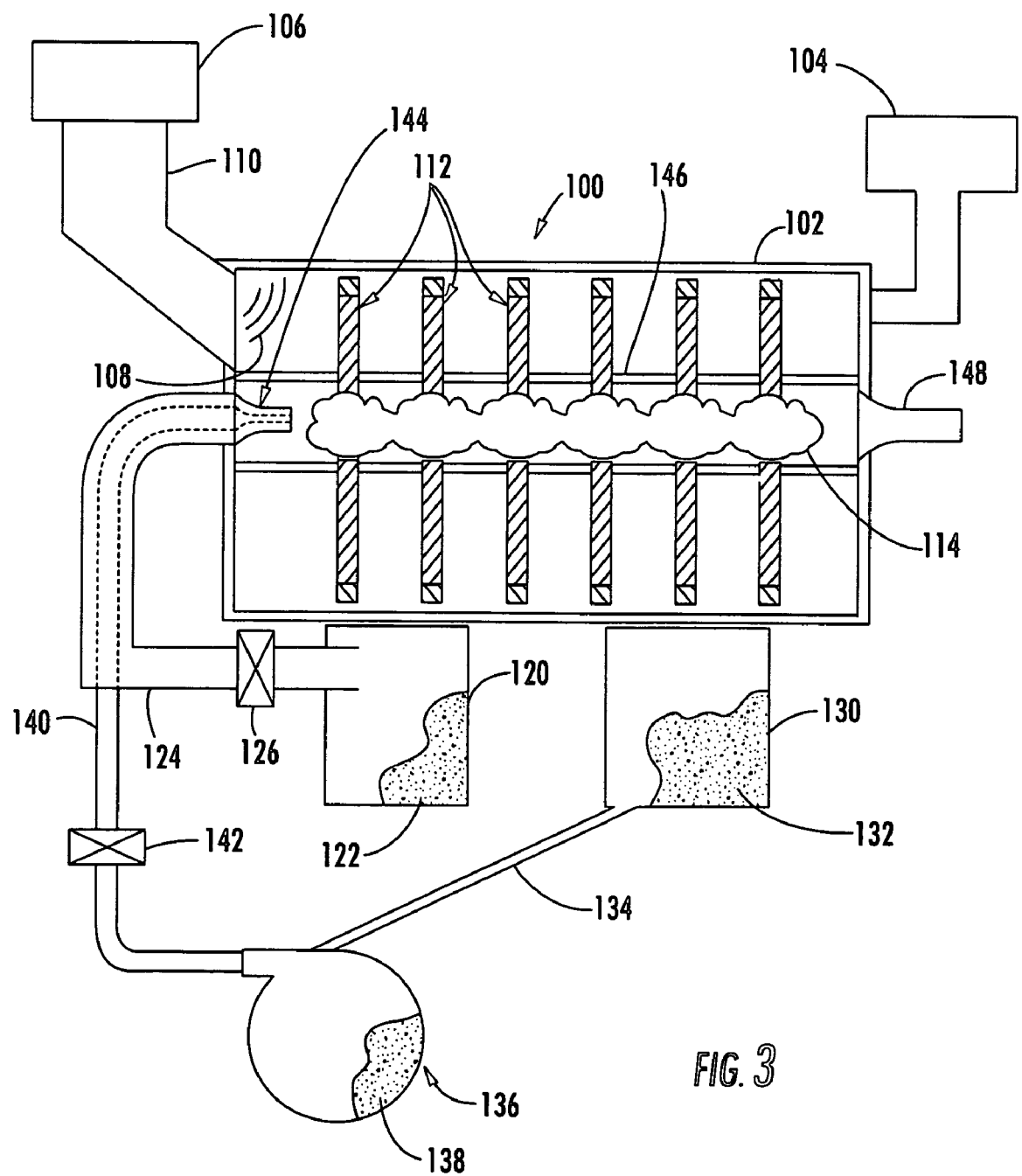
FIG. 3 is a schematic illustration of a microwave plasma system.

FIG. 3 illustrates a more complex embodiment. Microwave plasma system 100 has a microwave applicator 102, a process gas source 120, a process material source 130, and a carrier gas source 136. A magnetron 106 produces microwaves 108 that are fed into applicator 102 through wave guide 110. A series of plasma generators 112 are installed in applicator 102. In this embodiment, each of the plasma generators 112 is the plasma generator 10 depicted in FIGS. 1A and 1B.

A vacuum pump 104 evacuates microwave applicator 102. Process gas source 120 pumps process gas 122 into applicator 102 through conduit 124, regulated by valve 126. When microwaves 108 hit plasma generators 112 in the presence of carrier gas 138 they initiate a plasma 114 in each of the plasma generators 112.

Process material source 130 contains process material 132 that is conveyed via conduit 134 to carrier gas source 136 where the process material 132 is mixed and entrained with carrier gas 138. Carrier gas 138 is an example of a process flow gas. In some embodiments, process material 132 is gaseous. In those embodiments, the process material may be both the process material and the process flow gas. In FIG. 3, process material 132 is solid powder, and the mixture of process material 132 and carrier gas 138 is transported to the interior of applicator 102 through conduit 140, regulated by valve 142 to establish a desired process material flow rate. Alternate process material rate controller mechanisms may also be used alone or in combination with others to establish the desired process material flow rate. Examples of such alternate process rate controller mechanisms are a flow rate regulator installed on process material source 130 or installed on conduit 134. In some embodiments the process material is a solid material, such as a rod or wire. In those embodiments the process material rate controller mechanism may be a feeder spool, such as that used in welding, or a linear actuator that pushes the process material into the plasma 114.

In the embodiment depicted in FIG. 3, conduits 124 and 140 become coaxial as they approach applicator 102. Process gas 122, process material 132, and carrier gas 138 are propelled into the applicator 102 through inlet nozzle 144. In alternate embodiments, conduit 124 may introduce process gas 122 into applicator 102 through a process gas inlet (not shown) that is not integrated with inlet nozzle 144. The process material 132 passes through plasma 114 in applicator 102 where the process material 132 is transformed by ions created from process gas 122 by plasma 114. In some embodiments the process material 132 undergoes physical modification, typically melting or vaporizing. In some embodiments the process material may undergo a chemical modification, which refers to a transformation that modifies the chemical composition of the process material 132. In some embodiments the surface of the process material may be transformed, meaning that it undergoes surface modification. Surface modification refers to a transformation where only the surface (and not the entire body) of the process material is either physically or chemically modified. Typically the effects of surface modification extend into the process material down to a depth of a few mils. An example of a surface modification would be carbonizing, nitriding, or oxidizing the surface of process material particles. The transformed process material is ejected through outlet nozzle 148 where it may be collected for future use or applied directly onto an application substrate material or other "workpiece." Outlet nozzle 148 is an example of a spray port. A spray port is an apparatus element that is configured to spray or deposit plasma-modified material onto a workpiece or into a collection vessel.

In the embodiment of FIG. 3, a segmented microwave transparent tube 146 connects inlet nozzle 144 with outlet nozzle 148. Plasma generators 112 are installed between the segments of tube 146. Even if the joints between the segments of tube 146 and the plasma generators 112 are not gas tight, tube 146 helps direct the flow of process gas 122, process material 130, and carrier gas 138 through the applicator 102. Such flow may be further enhanced by providing a comparatively high pressure inert gas between the interior of the walls of applicator 102 and the exterior wall of tube 146.

Figure 4A:
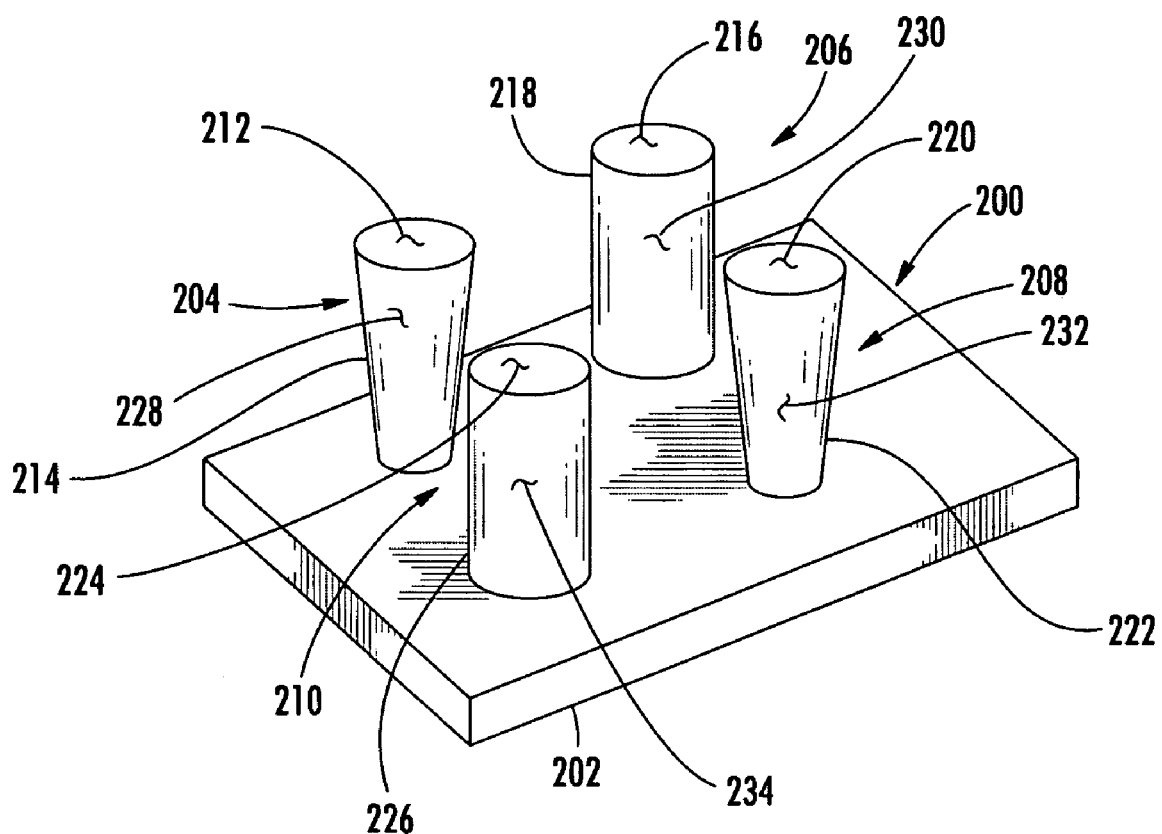
FIG. 4A is a perspective drawing of an alternate plasma generator according to the invention.
Figure 4B:
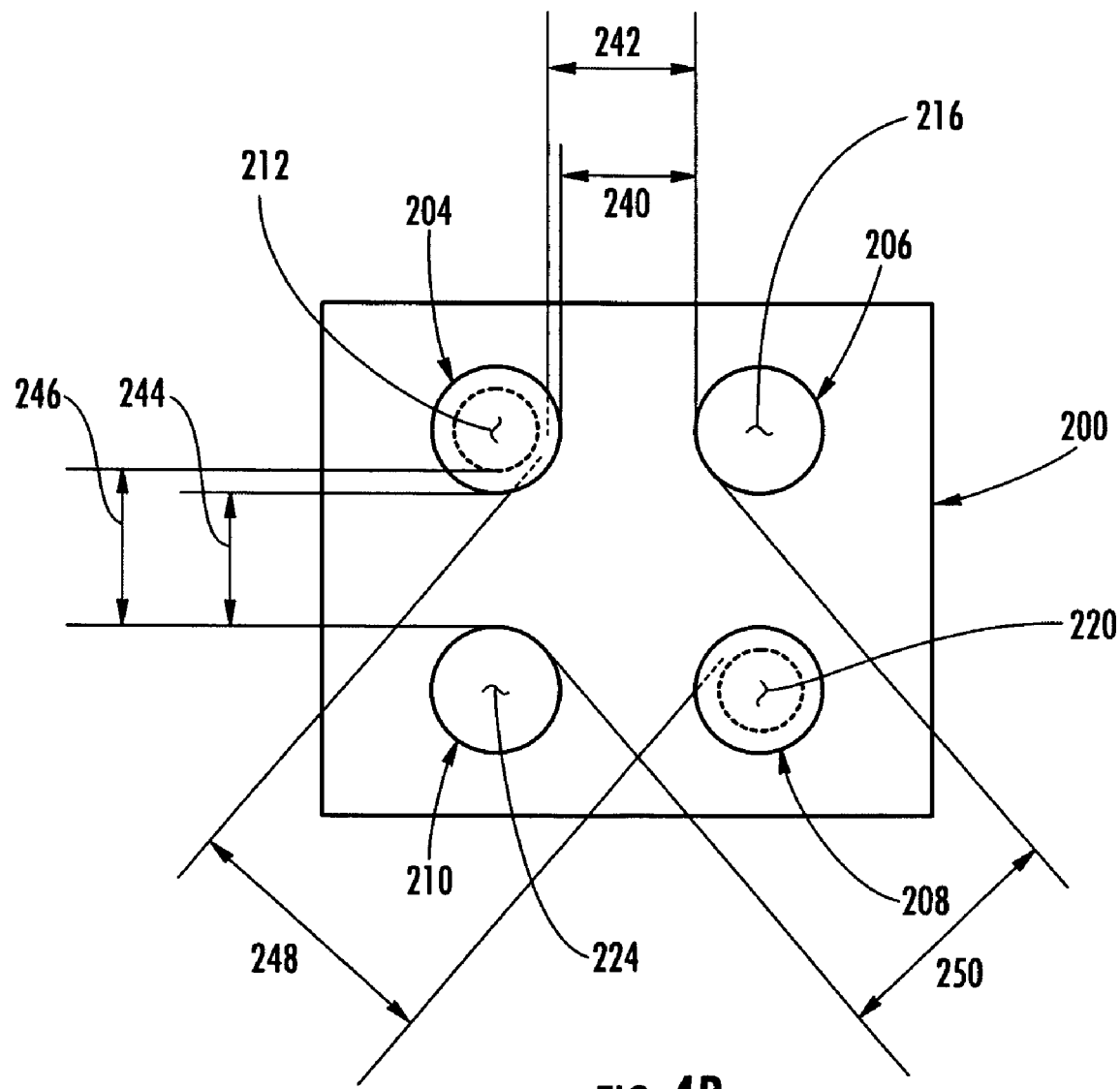
FIG. 4B is a plan view of the plasma generator of FIG. 4A.

FIGS. 4A and 4B illustrate a further embodiment. As shown in the perspective drawing of FIG. 4A, plasma generator 200 has a conductive plate 202 and conductive fingers 204, 206, 208 and 210 that are mounted in a symmetrical pattern on the conductive plate 202. As in other embodiments, conductive plate 202 is provided in part to establish electrical continuity between conductive fingers 204, 206, 208 and 210. Alternate conductive mechanisms such as a wire mesh or a conductive film could be used as an alternative to conductive plate 202 for establishing electrical continuity between conductive fingers 204, 206, 208 and 210. Conductive finger 204 has a tip 212 and a post 214; conductive finger 206 has a tip 216 and a post 218; conductive finger 208 has a tip 220 and a post 222; and conductive finger 210 has a tip 224 and a post 226. Position 228 is any arbitrary position on the surface of post 214; position 230 is any arbitrary position on the surface of post 218; position 232 is any arbitrary position on the surface of post 222; position 234 is any arbitrary position on post 226. Conductive fingers 204 and 208 are right conical cylinders having their widest orthogonal cross section at their tips 212 and 220 respectively. Conductive fingers 206 and 210 are right straight cylinders having substantially uniform orthogonal cross sections.

Plasma generator 200 is designed to be placed in a microwave applicator with a process gas and exposed to microwaves whereby the conductive fingers 204, 206, 208 and 210 of plasma generator 200 initiate a plasma. In the most preferred embodiments the design incorporates proximal tips, so the plasma is formed at or near the tips 212, 216, 220, and 224 of conductive fingers 204, 206, 208 and 210 respectively. This is beneficial in making the plasma accessible for exposure to process materials. FIG. 4B is a plan view of plasma generator 200. In this embodiment of proximal tips, it is seen that for tips 212, 216, 220, 224 of conductive fingers 204, 206, 208, 210, the distance between the tip of a conductive finger and the closest tip of another conductive finger is less than the distance between any other point on the surface of the post of that conductive finger and any position on the surface of the post of another conductive finger. This relationship is true for every conductive finger. FIG. 4B further illustrates how this is accomplished in this embodiment.

Distance 240 is the distance between the tip 212 of conductive finger 204 and the tip 216 of conductive finger 206. Distance 244 is the distance between the tip 212 of conductive finger 204 and the tip 224 of conductive finger 210. Due to the symmetry of this embodiment, distances 240 and 244 are substantially equal.

Distance 242 is the distance between any arbitrary point (228 in FIG. 4A) on the post (214 in FIG. 4A) of conductive finger 204 and any arbitrary point (230 in FIG. 4A) on the post (218 in FIG. 4A) of conductive finger 206. Distance 246 is the distance between any arbitrary point (228 in FIG. 4A) on the post (214 in FIG. 4A) of conductive finger 204 and any arbitrary point (234 in FIG. 4A) on the post (226 in FIG. 4A) of conductive finger 210.

In the embodiment illustrated in FIGS. 4A and 4B, distance 240 is less than distance 242, and distance 244 is less than distance 246. Distance 240 is also less than the distance (not labeled) between the tip 212 of conductive finger 204 and any arbitrary point (230 in FIG. 4A) on the post (214 in FIG. 4A) of conductive finger 206 because that unlabeled distance would include an elevation component in addition to distance 240. Similarly, Distance 244 is less than the distance (not labeled) between the tip 212 of conductive finger 204 and any arbitrary point (234 in FIG. 4A) on the post (226 in FIG. 4A) of conductive finger 210 because that unlabeled distance would also include an elevation component in addition to distance 244.

Distance 248 is the distance between any arbitrary point (228 in FIG. 4A) on the post (214 in FIG. 4A) of conductive finger 204 and any arbitrary point (232 in FIG. 4A) on the post (222 in FIG. 4A) of conductive finger 208. Distance 250 is the distance between any arbitrary point (234 in FIG. 4A) on the post (226 in FIG. 4A) of conductive finger 210 and any arbitrary point (230 in FIG. 4A) on the post (218 in FIG. 4A) of conductive finger 206. Distances 240 and 244 are both less than distance 248 and distance 250. Thus it is seen that for every finger, the distance between the tip of the conductive finger and the closest tip of another conductive finger is less than the distance between any other point on the surface of the post of the conductive finger and any position on the surface of the post of another conductive finger.

Figure 5:
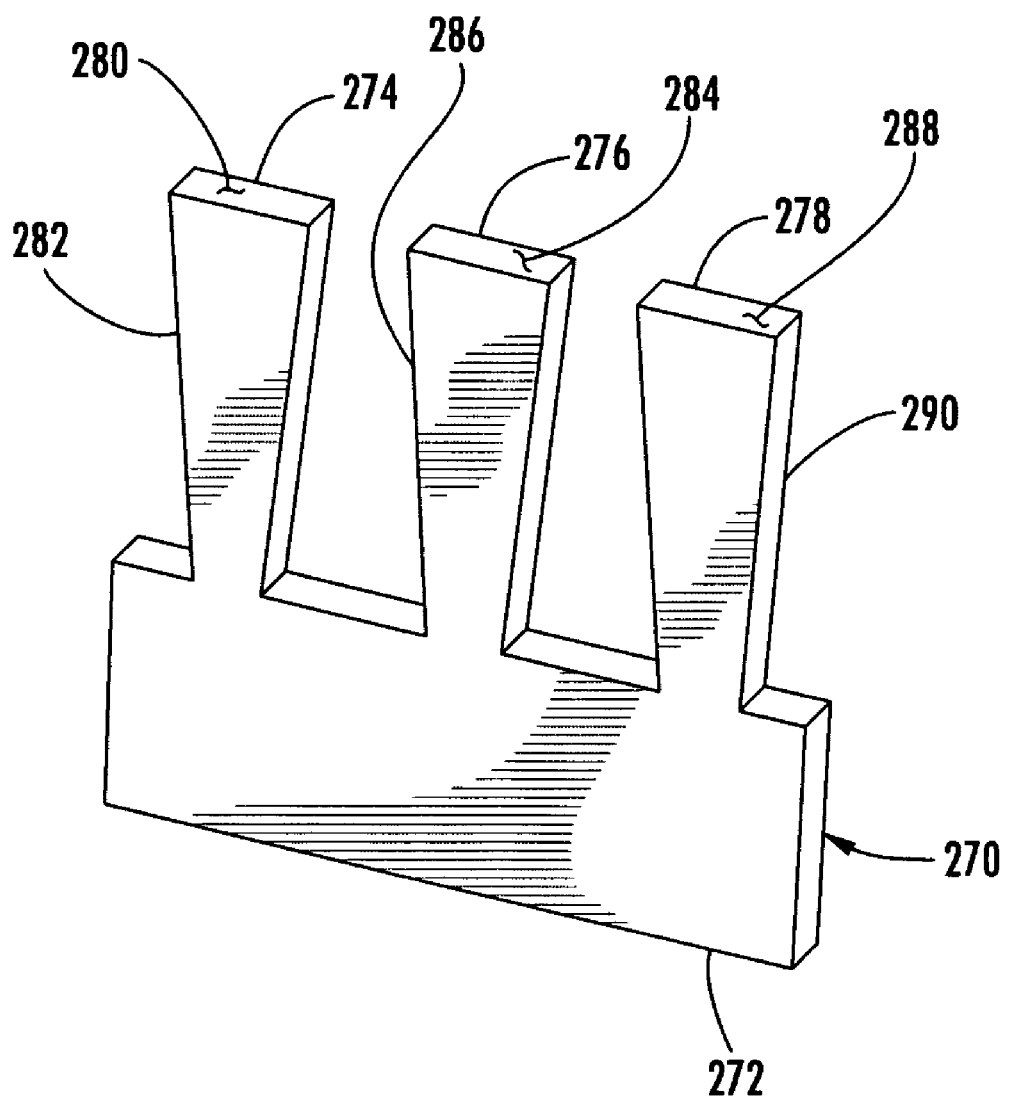
FIG. 5 is an embodiment of a further alternate plasma generator according to the invention.

FIG. 5 illustrates yet another embodiment incorporating proximal tips. Plasma generator 270 has a base 272 and three conductive fingers, 274, 276, and 278. Conductive finger 274 has a tip 280 and a post 282; conductive finger 276 has a tip 284 and a post 286; conductive finger 278 has a tip 288 and a post 290. This configuration represents a substantially linear array of conductive fingers since posts 282, 286 and 290 are aligned in the same geometric plane. Even if the geometric plane is curved, the configuration is still considered to be a linear array. Also, even if the conductive fingers are alternately bent in and out, such as the teeth of a saw blade so that the saw blade cuts a kerf, the configuration is still considered to be a linear array. Here again in the embodiment of FIG. 5, for every conductive finger the distance between the tip of the conductive finger and the closest tip of another conductive finger is less than the distance between any other point on the surface of the post of the conductive finger and any position on the surface of the post of another conductive finger.

Figure 6:
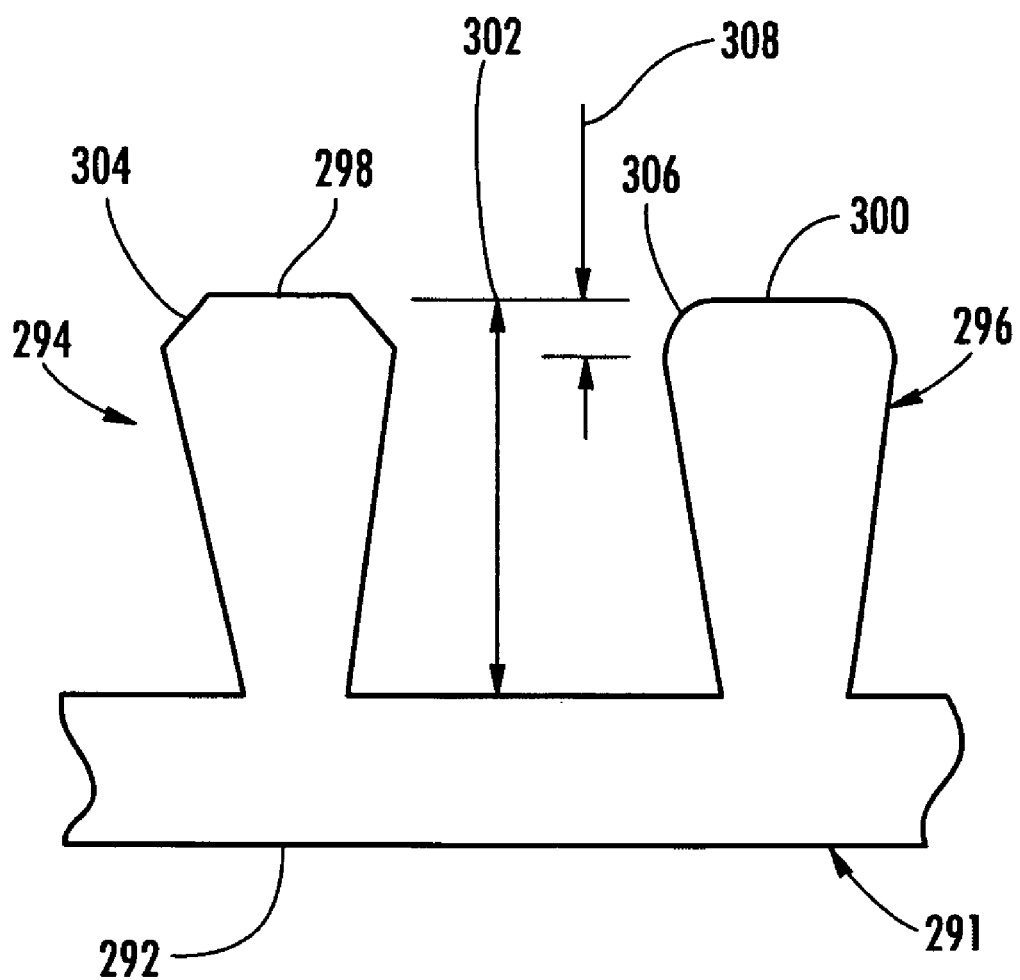
FIG. 6 illustrates two alternate configurations of conductive fingers for plasma generators.

FIG. 6 illustrates an alternate embodiment of a conductive fingers portion of a plasma generator having proximal tips. A plasma generator 291 has a conductive base 292 and two conductive fingers 294 and 296. Conductive finger 294 has a tip 298 and conductive finger 296 has a tip 300. Both conductive fingers 294 and 296 have a length 302. The tip 298 of conductive finger 294 has a chamfer 304, and the tip 300 of conductive finger 296 has a rounding 306. Chamfer 304 and rounding 306 have a depth which is illustrated as depth 308 for rounding 306 associated with finger 296. "Depth" is the distance that a chamfer (e.g., 304) or rounding (e.g., 306) extends from the tip (e.g., 300) of a conductive finger (e.g., 296) toward the conductive base (292 here) of the plasma generator (291 here). Preferably the depth (e.g., 308) of the chamfer and the rounding does not exceed 20% of the length (e.g., 302) of a conductive finger (e.g., 296). In such configurations, because of substantially the same functionality as the plasma generators of FIGS. 4A, 4B and 5, the distance between the tip of every conductive finger and the closest tip of another conductive finger is still considered to be less than the distance between any other point on the surface of the post of the conductive finger and any position on the surface of the post of another conductive finger.

Figure 7:
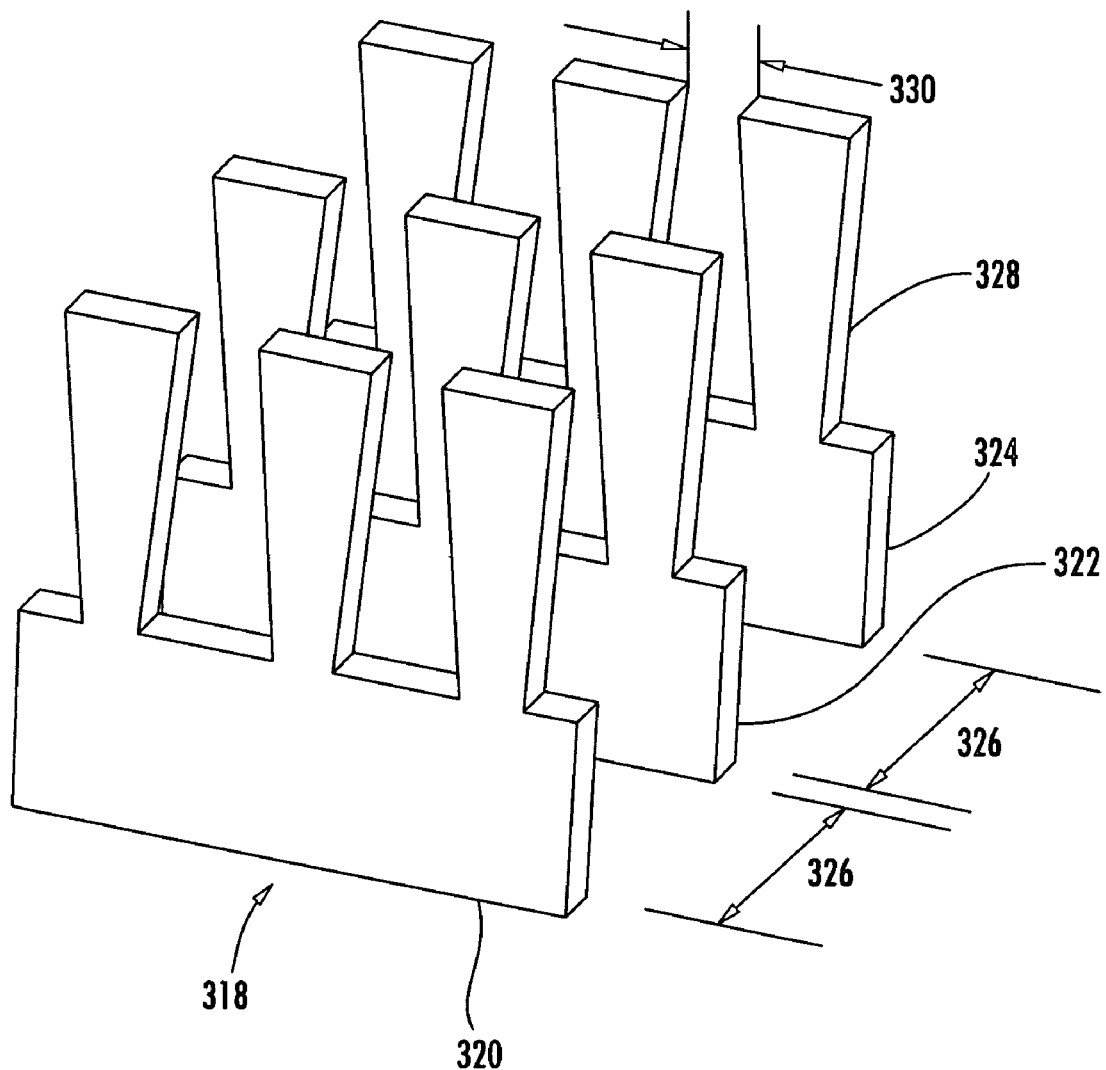
FIG. 7 illustrates three linear arrays of plasma generators.

FIG. 7 illustrates another microwave plasma system embodiment employing proximal tips. This embodiment is useful for creating a planar volume of plasma. Microwave plasma system 318 has three linear plasma generator arrays 320, 322, and 324, mounted in electrical continuity on a conductive plate (not shown). For simplicity of illustration, generator arrays 320, 322, and 324 have uniform spacing distances 326, and each array has the same tip 328 design and the same tip spacing 330. As long as the tip spacing 330 is less than spacing distances 326, the distance between the tip of a conductive finger and the closest tip of another conductive finger is less than the distance between any other point on that conductive finger and any point on another conductive finger. This spacing ensures that the arc that generates the plasma will form between the tips of the conductive fingers on the same array (e.g., 320, 322 or 324).

Figure 8:
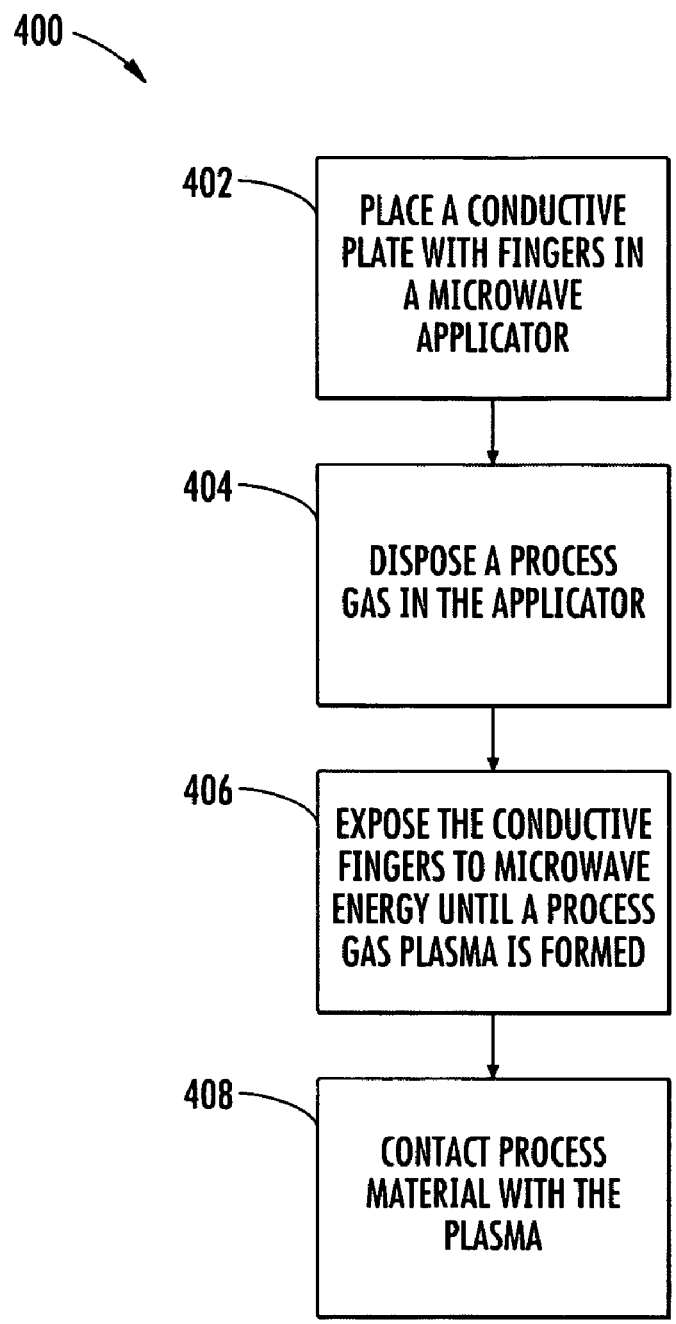
FIG. 8 is a flowchart of a method according to the invention.

FIG. 8 presents a flow chart of a method embodiment 400. This embodiment begins at step 402 with placing conductive fingers preferably having proximal tips in a microwave applicator followed by step 404, disposing a process gas in the applicator. The next step 406 is exposing the conductive fingers to microwave energy such that a process gas plasma is produced. The method concludes with step 408, contacting a process material with the plasma. The steps of disposing a process gas in the applicator and exposing the conductive fingers to microwave energy may be performed simultaneously or with either step preceding the other.

Microwave plasma systems have several important features. First, they allow microwaves or other Electro Magnetic Field (EMF) devices to convert EMF directly to a tightly controlled aperture of electrical discharge. This can then be converted to plasma by passing a gas through the aperture. Since plasmas absorb microwave energy directly, this high energy can be volumetrically constrained by the plates and allows for materials to be processed through the plasma volume. By using an array of these plates, plasma can be extended by having the plasma from one aperture passing into the next aperture. Theoretically this will allow any practical length of plasma to be generated.

A second important feature of a microwave plasma system is that the design and configuration of a series of apertures and conductive fingers may be employed to control the residence time of materials processing. Specifically, designs that allow heating materials to almost any selected temperature from ambient to the temperature of the plasma may be created by increasing the residence time of the process materials in the plasma. The ability to vary the residence times for processing materials in the plasma area provides a convenient means to control the heating, softening, melting, vaporizing, or reacting of large quantities of a broad spectrum of materials.

Process materials such as fibers, wires, rods, gases, liquids, or powders may be processed in the plasma. Material in the form of a fiber, wire, rod, etc., may be pushed-fed or pulled-fed through plasma, gas may flow into the plasma, or powder may be transferred into the plasma using a carrier gas, or other transport mechanism. Process material such as a fiber may be mechanically passed through the plasma volume. If the process material is in a gas or powder form it may be carried through the plasma using a process flow gas. This allows for a wide variety of materials to be processed.

A third important feature of a microwave plasma system in some embodiments is the design and configuration of a series of the apertures and conductive fingers into a gun type arrangement for deposition of coating materials. Reduction of deposition velocity and density may be achieved by incorporating a diverging arrangement of the apertures and outlet nozzle. A converging arrangement may be used to accelerate the plasma feed gas velocity. The velocity of the feed materials (i.e., carrier gas velocity for the powder feedstock, push-pull rate of the wires, or flow velocity of gas or liquid feed materials) and the flow velocity of the plasma gas also influence the deposition velocity. The length of the plasma area may be established specifically to allow melting but not vaporization of the process materials. The molten particles may be accelerated or aspirated and deposited onto an application substrate material. The thermal energy imparted and the jet action velocity imparted to the molten particles are used to achieve a high velocity deposition. In such applications, the microwave plasma system overcomes certain limitations of other coating deposition processes such as thermal spray, physical vapor deposition, and chemical vapor deposition processes. Since the residence time for material processing in the hot zone can be engineered and controlled, a wide range of feedstock sizes (powder size distributions, wire diameters, etc.) may be used.

A fourth, significant, feature of some embodiments of a microwave plasma system is that its design and configuration can establish process residence times that allow complete vaporization of materials and the generation, formation, growth, and/or synthesis of nanostructured materials and components.

The foregoing descriptions of preferred embodiments for this invention have been presented for purposes of illustration and description. The descriptions are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A microwave plasma system, comprising:
an applicator providing microwaves having at least one wavelength;
a process gas in the microwaves;
at least one electrically conductive plate located in the microwaves, with each conductive plate having a plurality of tapered electrically conductive fingers that are electrically interconnected, each conductive finger having a tip that is adjacent to and disconnected from tips of adjacent conductive fingers, wherein arcing occurs between adjacent disconnected tips in the presence of the process gas and the microwaves, and wherein a process gas plasma is initiated;
and wherein the plurality of tapered conductive fingers are formed as tapered projections, each projection having two sides forming a base and narrowing to form at least portions of the tip, wherein the bases are arranged in an array having a centroid and the tips converge toward the centroid to form an aperture that opens to an array of tapered spacings extending between the sides of the adjacent conductive fingers, the spacings widening from the tips of adjacent conductive fingers to the bases of the adjacent conductive fingers.

2. The microwave plasma system of claim 1 wherein,
each finger has a length no less than approximately one fourth the shortest wavelength and wherein the conductive fingers form a closed array having an aperture.

3. The microwave plasma system of claim 1 further comprising a transport mechanism for conveying process material through at least a portion of the process gas plasma for a residence time.

4. The microwave plasma system of claim 3 wherein,
the microwaves have a wavelength of approximately four and three fourth inches (one hundred twenty one millimeters),
the conductive fingers have a length no less than approximately one inch (twenty five millimeters).

5. The microwave plasma system of claim 1 wherein the at least one conductive plate comprises:
a plurality of conductive plates axially aligned in the microwaves, with each conductive plate having a plurality of conductive fingers, each finger having a length no less than approximately one fourth the shortest wavelength and wherein the conductive fingers form a closed array having an aperture, the conductive fingers being configured to initiate a process gas plasma in the presence of the microwaves and the process gas.

6. The microwave plasma system of claim 5 further comprising a transport mechanism for conveying process material through at least a portion of the process gas plasma for a residence time.

7. The microwave plasma system of claim 5 further comprising a process material rate controller.

8. The microwave plasma system of claim 1 wherein the at least one conductive plate comprises:
a conductive plate located in the applicator, the conductive plate having a plurality of conductive fingers, each finger having a length and a tip and a post having a surface, where the length of each finger is no less than approximately one fourth the shortest microwave wavelength and where for every finger the distance between the tip of the finger and the closest tip of another finger is less than the distance between any other point on the surface of the post of the finger and any position on the surface of the post of another finger, the conductive fingers being configured and positioned to initiate a process gas plasma in the presence of the microwaves and the process gas.

9. The microwave plasma system of claim 8 further comprising a transport mechanism for conveying process material through at least a portion of the process gas plasma for a residence time.

10. The microwave plasma system of claim 8 wherein at least a portion of the conductive fingers form at least one substantially linear array.

* * * * *